United States Patent
Mehard et al.

(10) Patent No.: US 7,498,264 B2
(45) Date of Patent: Mar. 3, 2009

(54) METHOD TO OBTAIN FULLY SILICIDED POLY GATE

(75) Inventors: Freidoon Mehard, Plano, TX (US); Shafoeng Yu, Plano, TX (US); Joe G. Tran, Flower Mound, TX (US)

(73) Assignee: Texas Instruments Incorporated, Dallas, TX (US)

( * ) Notice: Subject to any disclaimer, the term of this patent is extended or adjusted under 35 U.S.C. 154(b) by 288 days.

(21) Appl. No.: 11/176,725

(22) Filed: Jul. 7, 2005

(65) Prior Publication Data

US 2007/0010062 A1 Jan. 11, 2007

(51) Int. Cl.
*H01L 21/302* (2006.01)
*H01L 21/461* (2006.01)

(52) U.S. Cl. .................. 438/692; 438/592; 438/595; 438/622; 257/E21.593; 257/E21.23

(58) Field of Classification Search .................. 438/696, 438/697; 257/E21.304
See application file for complete search history.

(56) References Cited

U.S. PATENT DOCUMENTS 6,645,801 B1  11/2003  Ramsbey et al.

6,858,484 B2 * 2/2005 Nishihara et al. ........... 438/199

FOREIGN PATENT DOCUMENTS

JP 2001031951 * 2/2001

* cited by examiner

*Primary Examiner*—Zandra Smith
*Assistant Examiner*—Sonya D McCall Shepard
(74) *Attorney, Agent, or Firm*—Frederick J. Telecky, Jr.; Wade J. Brady, III (57) ABSTRACT

The present invention provides a method of fabricating a microelectronics device. In one aspect, the method comprises forming a spacer material 160 over gate electrodes 150 that are, in turn, located over a microelectronics substrate 110. The gate electrodes 150 have a doped region 170a located between them. A portion of the spacer material 160 is removed with a chemical/mechanical process using a slurry that is selective to a portion of the spacer material 160. The method further comprises etching a remaining portion of the spacer material 163, 165, 168 to form spacer sidewalls 163, 165, 168 on the gate electrodes 150. The etching exposes a surface of the gate electrodes 150 and leaves a portion of the spacer material 168 over the doped region 170a. Metal is then incorporated into the gate electrodes 150 to form silicided gate electrodes 150.

20 Claims, 6 Drawing Sheets

METHOD TO OBTAIN FULLY SILICIDED POLY GATE

TECHNICAL FIELD OF THE INVENTION

The present invention is directed in general to a method for manufacturing a microelectronics device, and more specifically, to a method of achieving a fully silicided poly gate.

BACKGROUND

Metal gate electrodes are currently being investigated to replace polysilicon gate electrodes in today's ever shrinking and changing transistor devices. One of the principle reasons the industry is investigating replacing the polysilicon gate electrodes with metal gate electrodes is to solve problems of poly-depletion effects and boron penetration for future CMOS devices. Traditionally, a polysilicon gate electrode with an overlying silicide was used for the gate electrodes in CMOS devices. However, as device feature sizes continue to shrink, poly depletion and gate sheet resistance become serious issues when using polysilicon gate electrodes.

Accordingly, metal gates have been proposed. However, in order to optimize the threshold voltage ($V_t$) in high-performance devices, the metal gates need tunable work functions. For instance, the metal gates need tunable work functions for NMOS and PMOS devices similar to present polysilicon gate technology, requiring the work functions of metal gates to range from 4.1~4.4 eV for NMOS and 4.8~5.1 eV for PMOS (see, B. Cheng, B. Maiti, S. Samayedam, J. Grant, B. Taylor, P. Tobin, J. Mogab, *IEEE Intl. SOI Conf. Proc.*, pp. 91-92, 2001).

Recently, silicided metal gates have been investigated based on the extension of existing self-aligned silicide (SALICIDE) technology. In this approach, polysilicon is deposited over the gate dielectric. A metal is deposited over the polysilicon and reacted to completely consume the polysilicon resulting in a fully silicided metal gate, rather than a deposited metal gate. The silicided metal gate provides a metal gate with the least perturbation to the conventional process and avoids contamination issues. Furthermore, poly doping has been shown to affect the work function of the silicided metal gates.

Complications can arise, however, during the silicidation process. For example, in some conventional processes, an etch is conducted prior to the silicidation process to form sidewall spacers, which can expose substrate regions between adjacent transistors to the silicidation process. In such instances, the silicidation process can extended deeply into the moat region, which in turn, can cause shorts to occur in the device.

Accordingly, what is needed in the art is a silicidation process that avoids the deficiencies of the conventional processes discussed above.

SUMMARY OF INVENTION

To overcome the deficiencies in the prior art, the present invention, in one embodiment, provides a method of fabricating a microelectronics device. In one embodiment, the method comprises forming a spacer material over gate electrodes that are, in turn, located over a microelectronics substrate. The gate electrodes have a doped region located between them. A portion of the spacer material is removed with a chemical/mechanical process using a slurry that is selective to the spacer material. The method further comprises etching a remaining portion of the spacer material to form spacer sidewalls on the gate electrodes. The etching exposes a surface of the gate electrodes and leaves a portion of the spacer material over the doped region. Metal is incorporated into the gate electrodes to form silicided gate electrodes.

In another embodiment, the present invention comprises a method of siliciding gate electrodes of a microelectronics device. In this embodiment, the method comprises forming a spacer material that comprises a nitride layer located over an oxide layer. The spacer material is formed over gate electrodes that have a first doped region located between them and are located over a microelectronics substrate. The method further comprises removing a portion of the nitride layer with a chemical/mechanical process using a slurry that has a removal rate ratio of oxide to nitride of about 13:1. An etch of the spacer material is conducted to form spacer sidewalls on the gate electrodes, which exposes the upper surface of the gate electrodes and leaves a portion of the oxide layer over the doped region. Metal is incorporated into the gate electrodes using a silicidation process and the remaining portion of the oxide layer is removed. The method also comprises forming a second doped region between the gate electrodes.

Another embodiment provides a method of fabricating an integrated circuit. This method comprises forming transistors that have silicided gate electrodes and that are located over a microelectronics substrate. The method of forming the silicided gate electrodes comprises creating a first doped source/drain region between the gate electrodes, depositing a spacer material over the gate electrodes and the first doped source/drain region, removing a portion of the spacer material with a chemical/mechanical process using a slurry that is selective to the spacer material, etching the spacer material to form spacer sidewalls on the gate electrodes, which exposes a surface of the gate electrodes and leaves a portion of the spacer material over the mildly doped source/drain region, incorporating a metal into the gate electrodes to form silicided gate electrodes, and forming a second doped region between the gate electrodes. Dielectric layers are formed over the silicided gate electrodes, and interconnects are formed in the dielectric layers to electrically connect the transistors to form an operative integrated circuit.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
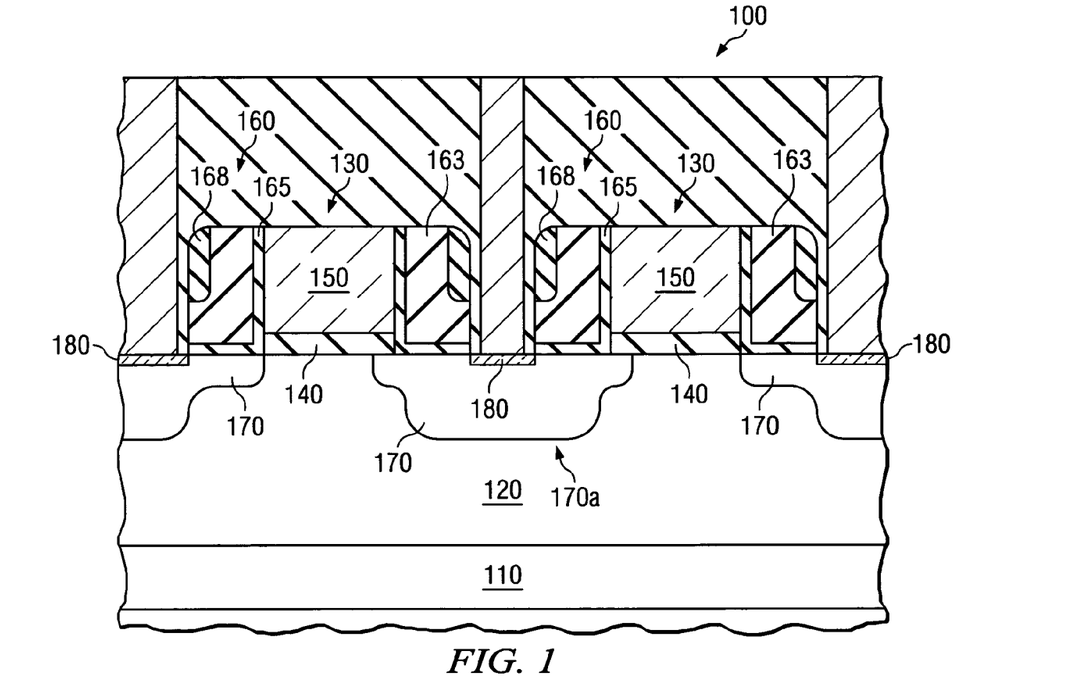
FIG. 1 illustrates a partial sectional view of one embodiment of a microelectronics device, as provided by the present invention.

Turning initially to FIG. 1, there is illustrated a partial sectional view of one embodiment of a microelectronics device 100, as provided by the present invention. The microelectronics device 100 includes a substrate 110. Located within the substrate 110 in the embodiment of FIG. 1 is a well region 120. Located over the substrate 110 and well region 120 are gate structures 130.

The gate structures 130 illustrated in FIG. 1 each include a gate oxide 140 located over the substrate 110, as well as a fully silicided gate electrode 150 located over the gate oxide 140. The silicided gate electrode 150 may have a variety of thicknesses, although a thickness ranging from about 50 nm to about 150 nm is exemplary. The silicided gate electrode 150, when constructed in accordance with the principles of the present invention, may comprise a number of different materials. For instance, in the illustrative embodiment shown in FIG. 1 the silicided gate electrode 150 comprises nickel, however, it is envisioned that the silicided gate electrode 150 could comprise cobalt, platinum, titanium, tantalum, molybdenum, tungsten, etc., while staying within the scope of the present invention.

The silicided gate electrode 150 may also include a dopant or combination of several types of dopants therein. The dopant, such as boron, phosphorous, arsenic or another similar dopant based on whether the semiconductor device 100 is operating as a PMOS device or an NMOS device, is configured to tune the minimum energy required to bring an electron from the Fermi level to the vacuum level, or the so called work function.

The gate structure 130 further contains gate sidewall spacers 160 flanking both sides of the silicided gate electrode 150 and gate oxide 140. The gate sidewall spacers 160 in the embodiment of FIG. 1 may each include one or more different layers. For instance the gate sidewall spacers 160 may also include nitride spacers 163 and sidewall oxides 165 and 168. The gate sidewall spacers 160 may comprise many different types and numbers of layers while staying consistent with the principles of the present invention.

The microelectronics device 100 illustrated in FIG. 1 additionally includes conventional source/drain regions 170 located within the substrate 110 and proximate the gate oxide 140 and within a moat region 170a located between the gate electrodes 150. Located within the source/drain regions 170 are silicided source/drain contact regions 180. The silicided source/drain contact regions 180 in this embodiment comprise nickel silicided source/drain contact regions 180. Nonetheless, other silicidation materials could be used to form the silicided source/drain regions 180 and remain within the scope of the present invention. The silicided source/drain contact regions 180 may have a depth into the source/drain regions 170 ranging from about 10 nm to about 30 nm, among others.

Figure 2:
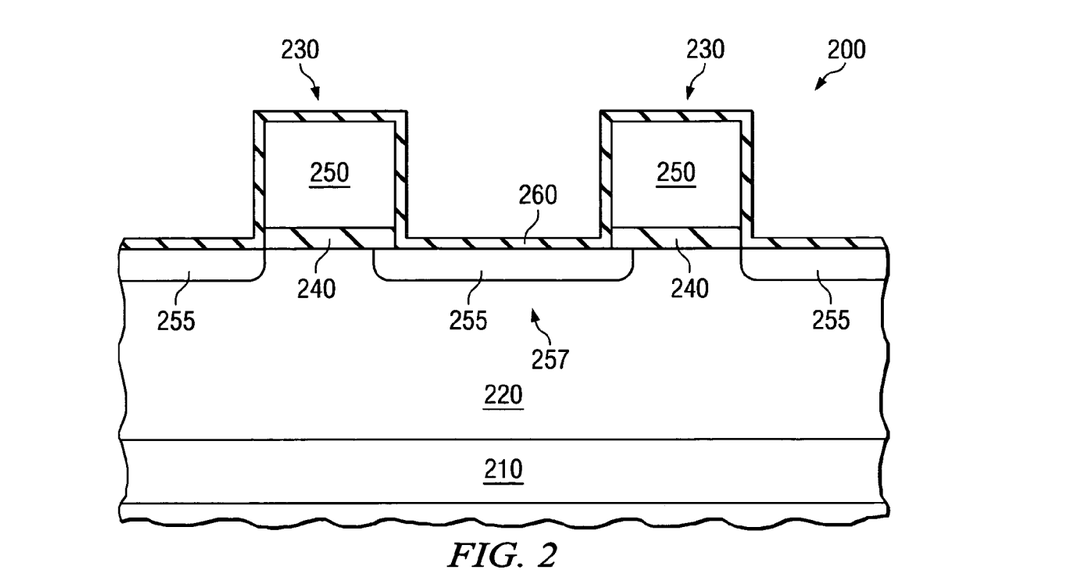
FIG. 2 illustrates a sectional view of a partially completed microelectronics device manufactured in accordance with the principles of the present invention and as discussed with respect to FIG. 1.

Turning now to FIGS. 2-7, illustrated are sectional views of detailed manufacturing steps instructing how one might, in an advantageous embodiment, manufacture a microelectronics device similar to the microelectronics device 100 depicted in FIG. 1. FIG. 2 illustrates a sectional view of a partially completed microelectronics device 200 manufactured in accordance with the principles of the present invention. The partially completed semiconductor device 200 of FIG. 2 includes a substrate 210. The substrate 210 may, in an exemplary embodiment, be any layer located in the partially completed semiconductor device 200, including a wafer itself or a layer located above the wafer (e.g., epitaxial layer). In the embodiment illustrated in FIG. 2, the substrate 210 is a P-type substrate; however, one skilled in the art understands that the substrate 210 could be an N-type substrate without departing from the scope of the present invention. In such cases, each of the dopant types described throughout the remainder of this document would be reversed. For clarity, no further reference to this opposite scheme will be discussed.

Located within the substrate 210 in the embodiment shown in FIG. 2 is a well region 220. The well region 220, in light of the P-type semiconductor substrate 210, would more than likely contain an N-type dopant. For example, the well region 220 would likely be doped with an N-type dopant dose ranging from about 1E13 atoms/cm$^2$ to about 1E14 atoms/cm$^2$ and at a energy ranging from about 100 keV to about 500 keV. This results in the well region 220 having a peak dopant concentration ranging from about 5E17 atoms/cm$^3$ to about 1E19 atoms/cm$^3$.

Located over the substrate 210 in the embodiment of FIG. 2 are gate structures 230. The gate structures 230 each includes a gate oxide 240 and a polysilicon gate electrode 250. The gate oxide 240 may comprise a number of different materials and stay within the scope of the present invention. For example, the gate oxide 240 may comprise silicon dioxide, or in an alternative embodiment comprise a high dielectric constant (K) material. In the illustrative embodiment of FIG. 2, however, the gate oxide 240 is a silicon dioxide layer having a thickness ranging from about 0.5 nm to about 5 nm.

Any one of a plurality of well known manufacturing techniques could be used to form the gate oxide 240. For example, the gate oxide 240 may be grown. Additionally, the growth step may require a significant number of different temperatures, pressures, gasses, flow rates, etc., all of which are well known to those who are skilled in the art.

While the advantageous embodiment of FIG. 2 dictates that the polysilicon gate electrode 250 comprise standard polysilicon, other embodiments exist where the polysilicon gate electrode, or at least a portion thereof, comprises amorphous polysilicon. The amorphous polysilicon embodiment may be particularly useful when a substantially planar upper surface of the polysilicon gate electrode 250 is desired.

The deposition conditions for the polysilicon gate electrode 250 may vary, however, if the polysilicon gate electrode 250 were to comprise standard polysilicon, such as the instance in FIG. 2, the polysilicon gate electrode 250 could be deposited using a pressure ranging from about 100 torr to about 300 torr, a temperature ranging from about 620° C. to about 700° C., and a $SiH_4$ or $Si_2H_6$ gas flow ranging from about 50 sccm to about 150 sccm. If, however, amorphous polysilicon were desired, the amorphous polysilicon gate electrode could be deposited using a pressure ranging from about 100 torr to about 300 torr, a temperature ranging from about 450° C. to about 550° C., and a $SiH_4$ or $Si_2H_6$ gas flow ranging from about 100 sccm to about 300 sccm. In any instance, the polysilicon gate electrodes 250 desirably have a thickness ranging from about 50 nm to about 150 nm, and in one embodiment, the thickness is about 80 nm. Conventional blanket deposition and patterning processes may be used to form the gate electrodes 250 and gate oxides 240. Following the patterning of the gate electrodes 250 and gate oxides 240, medium doped drain (MDD) regions 255 are conventionally formed adjacent the gate electrodes 250 and in the moat region 257 between the gate electrodes 250. The MDD regions 255 are conventionally formed and generally have a peak dopant concentration ranging from about 1E19 atoms/$cm^3$ to about 2E20 atoms/$cm^3$. As is standard in the industry, the MDD regions 255 have a dopant type opposite to that of the well region 220 they are located within.

The partially completed semiconductor device 200 illustrated in FIG. 2 further includes a conventionally deposited pad oxide layer 260 located over the polysilicon gate electrodes 250, resulting in capped polysilicon gate electrodes 250. Conventional processes, such as chemical vapor deposition, may also be used to form the pad oxide layer 260 over the gate electrodes 250. The pad oxide layer 260, which preferably comprises an oxide, is designed to help protect the regions adjacent the gate electrodes 250 during subsequent processing steps, after the formation of the gate electrodes 250. In certain exemplary embodiments, it forms a portion of the sidewall spacer, as discussed below. The thickness of the pad oxide layer 260 may vary. For example, its thickness can range from about 10 nm to about 300 nm, but in one advantageous embodiment, the thickness may be about 15 nm.

Figure 3:
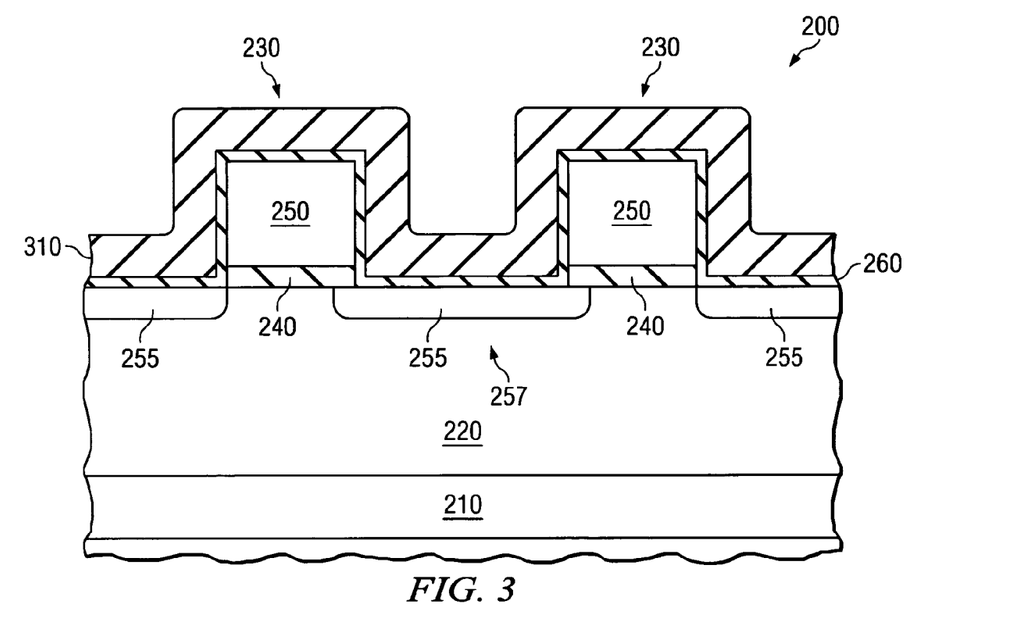
FIG. 3 illustrates a sectional view of the partially completed microelectronics device illustrated in FIG. 2 after the conventional deposition of a nitride layer.

Turning briefly to FIG. 3 illustrated is a sectional view of the partially completed microelectronics device 200 illustrated in FIG. 2 after the conventional deposition of a nitride layer 310. The nitride layer 310 may comprise a standard silicon nitride or a silicon nitride layer having carbon therein. If the nitride layer 310 were to contain the carbon, the carbon might form from about 5% to about 10% of the layer. The thickness of the nitride layer 310 may also vary, depending on design. However, in an advantageous embodiment, the nitride layer 310 has a thickness of about 80 nm and is deposited using a silane and nitrogen gas mixture. The nitride layer 310 is etched to form a sidewall spacer on each side of the gates, as discussed below.

Figure 4:
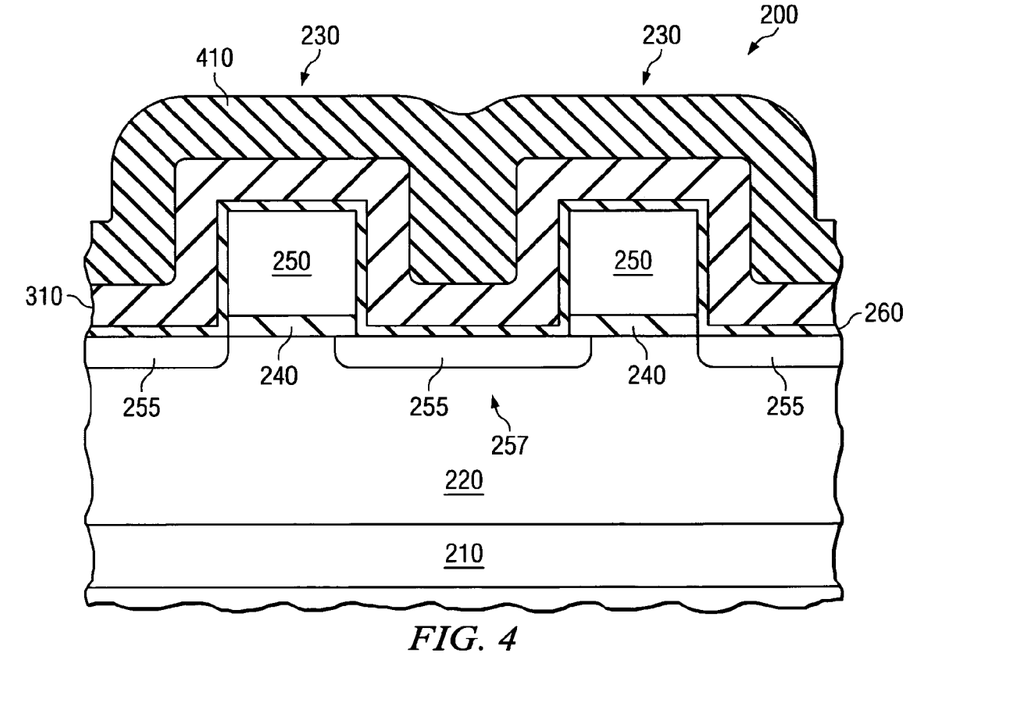
FIG. 4 illustrates a sectional view of the partially completed microelectronics device illustrated in FIG. 3 after the conventional deposition of an oxide layer.

Referring briefly now to FIG. 4, there is shown a sectional view of the partially completed microelectronics device 200 illustrated in FIG. 3 after the conventional deposition of an oxide layer 410. The oxide layer 410 is blanket deposited over the nitride layer 310, and its thickness may range from about 100 nm to about 150 nm. While only three different layers have been illustrated and discussed in the foregoing embodiments, it should be understood that the number of layers may vary, and certain embodiments, may include more than three layers. Moreover, it should be understood that any one or more of the layers may form a spacer material 415 that can be etched to form sidewall spacers for the gate electrodes 250.

Figure 5:
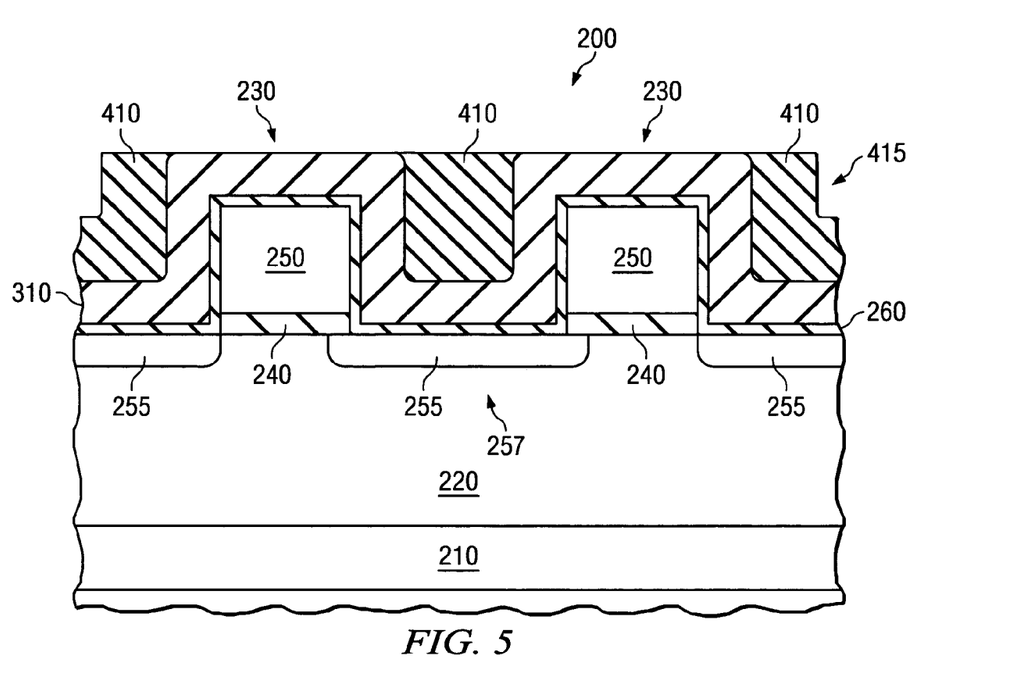
FIG. 5 illustrates a partial sectional view of the partially completed microelectronics device illustrated in FIG. 4 after a short chemical/mechanical polishing (CMP) step that removes a portion of the spacer material.

Turning now to FIG. 5, there is illustrated a partial sectional view of the partially completed microelectronics device 200 illustrated in FIG. 4 after a short chemical/mechanical polishing (CMP) step that removes a portion of the spacer material 415, including a portion of the nitride layer 310. The short CMP step is conducted so that a portion of the pad oxide layer 260 is left over the moat region 257 following an initial etch of the spacer material 415 so that the moat region 257 is protected during a subsequent silicidation of the gate electrodes 250. Contrary to conventional practices, the CMP process employs a slurry that is highly selective to the nitride layer 310. A highly selective slurry is one where the removal rate of oxide is substantially greater than the removal rate of nitride. For example, in one exemplary embodiment, the removal rate ratio of oxide to nitride is about 13:1. In one advantageous embodiment, the nitride selective slurry comprises cerium oxide, which is commercially available.

It has been found that using slurry that is selective to the nitride layer 310 provides superior removal results over conventional processes that typically use slurries that are designed to aggressively remove the nitride layer. Such conventional slurries do not provide the desired results because the nitride layer is removed too quickly and not enough of the nitride layer is left following the CMP removal. As a result, any subsequent etch removes too much of the underlying pad oxide layer 260 such that the moat region 257 is not adequately protected during silicidation of the gate electrodes 250 and particularly in those instances when the gate electrodes 250 are fully silicided.

In an advantageous embodiment, the short CMP is conducted until about 20 nm of the nitride layer 310 is removed. The pressure applied during this short CMP may vary, but it has been found that an exemplary pressure ranges from about 0.5 psi to about 2.0 psi with an exemplary time ranging from about 30 seconds to about 60 seconds. However, pressures much greater than about 2.0 psi, for example from about 4 to about 5 psi can remove too much of the nitride, which will not leave enough of the capping oxide 260 over the moat region 257 to adequately protect the moat region 257 for the silicidation process.

Figure 6:
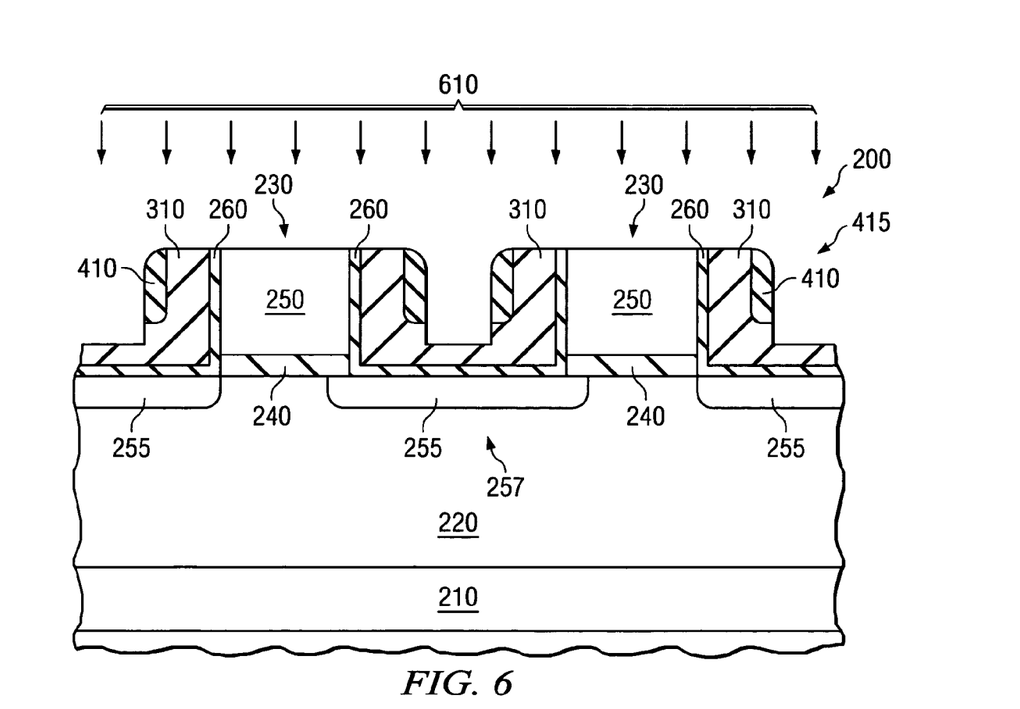
FIG. 6 illustrates a partial sectional view of the partially completed microelectronics device illustrated in FIG. 5 following an initial etch of the spacer material and full silicidation of the gate electrodes wherein a portion of the spacer material is left over the moat region.

Referring now to FIG. 6, there is illustrated a partial sectional view of the partially completed microelectronics device 200 illustrated in FIG. 5 following an initial etch 610 of the spacer material 415 and full silicidation of the gate electrodes 250. A conventional anisotropic etch is conducted to remove remaining portions of the oxide layer 410, as shown in FIG. 5 and to remove an initial portion of the nitride layer 310. The initial etch 610 exposes the upper surface of the gate electrodes 250 but leaves enough of the spacer material 415, such as the pad oxide layer 260 over the moat region 257 to adequately protect the moat region 257 from subsequent silicidation processes. In other embodiments, a small thickness (about 15 nm) of the nitride layer 310 may also be left in addition to the pad oxide layer 260 to further protect the moat region 257, a shown in FIG. 6. Because there is less material over the gate electrodes 250 than over the moat region 257, the etch leaves the pad oxide layer 260, or a small thickness of the nitride layer 310, essentially intact. Thus, the moat region 257 will be adequately protected during subsequent standard source/drain formation and over silicidation of the moat region 257 can be thereby avoided. In an advantageous embodiment, the initial etch 610 is conducted to leave about 15 to 30 nm of the spacer material 415 over the moat region 257. It should be understood that these thicknesses will vary, depending on the etch 610 that is performed and may be greater or less than those values just stated.

Figure 7A:
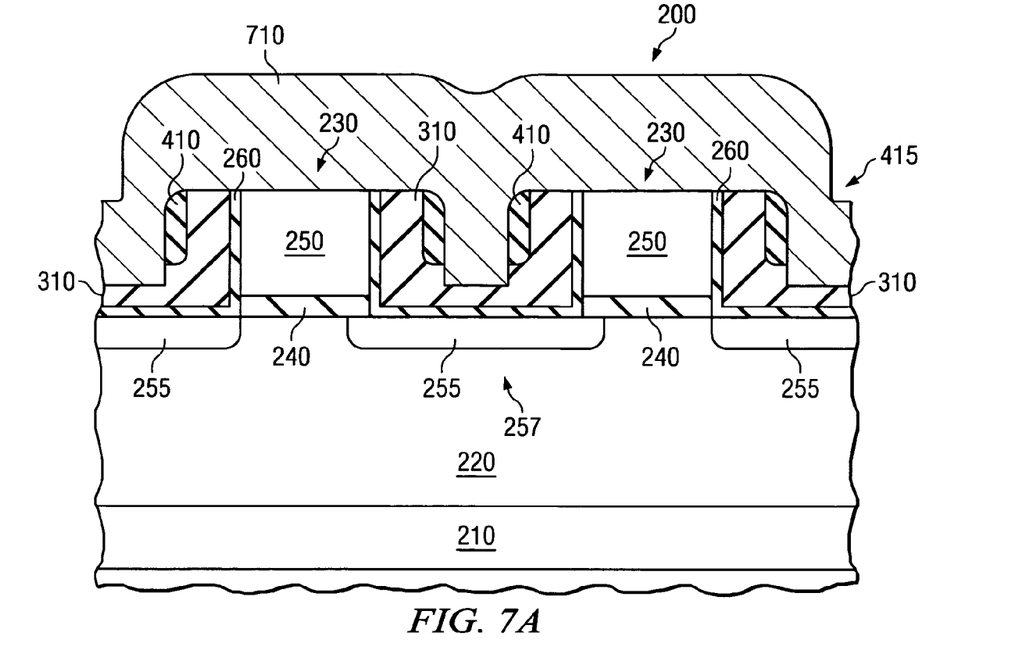
FIG. 7A illustrates a partial sectional view of the partially completed microelectronics device illustrated in FIG. 6 following the blanket deposition of a silicidation metal layer.

Turning now to FIG. 7A, a metal layer 710 is conventionally deposited over the exposed surfaces of the gate electrodes 250. The thickness of the metal layer 710 may vary and will depend, in some embodiments, on the thickness of the gate electrodes 250. For example, in one embodiment where the thicknesses of the gate electrodes 250 are about 80 nm thick, the thickness of the metal layer 710 will be about 60 nm. Preferably, the metal layer 710 is thick enough such that full silicidation of the gate electrodes 250 occurs. However, in other embodiments, full silicidation may not be necessary. In such cases, the metal layer 710 may be thinner. The silicidation can be conducted until the desired work function of the respective gate electrodes 250 is achieved or the gate electrodes 250 are fully silicided. As shown, the metal layer 710 covers the moat region 257 as well as the exposed surfaces of the gate electrodes 250, but the moat region 257 is protected from the metal layer 710 by the presence of the pad oxide layer 260 and the nitride layer 310, when it to is present.

The metal layer 710 may be nickel or cobalt or a combination thereof. In those embodiments where the metal layer 710 is nickel, an exemplary silicide process comprises placing a blanket of nickel layer over the gate electrodes 250. As it takes approximately 1 nm of nickel to fully silicidize approximately 1.8 nm of polysilicon, the thickness of the blanket layer of nickel should be at least 56% of the thickness of the polysilicon gate electrode 250. To be comfortable, however, it is suggested that the thickness of the layer of nickel should be at least 60% of the thickness of the polysilicon gate electrode 250. Thus, where the thickness of the polysilicon gate electrode 250 ranges from about 50 nm to about 150 nm, as described above, the thickness of the blanket layer of nickel should range from approximately 30 nm to about 90 nm. It should also be noted that the blanket layer of silicidation material may comprise a number of different metals or combinations of metals, such as nickel and cobalt, while staying within the scope of the present invention. The nickel layer and the gate electrodes 250 are subjected to a thermal anneal having a temperature ranging from about 400 degrees centigrade to about 600 degrees centigrade and for a period of time ranging from about 10 seconds to about 100 seconds. It should be noted, however, that the silicidation process may vary depending on the amount of silicidation that is desired and the materials that are used to silicide the gate electrodes 250. For example, if the gate electrodes 250 are silicided with a combination of cobalt and nickel, then the silicidation process parameters and percentages of materials used will be different than those just stated above. Those who are skilled in the art will understand how to achieve the desired degree of silicidation when using such metal combinations.

After fully siliciding the polysilicon gate electrode 250, any remaining unreacted metal materials can be removed using conventional processes. It should be noted that the silicide does not form on the moat region 257 at this time because of the spacer material layer 245, here shown as the pad oxide layer 260 and the nitride layer 310, that is located over the moat region 257 and blocks the silicidation process.

Figure 7B:
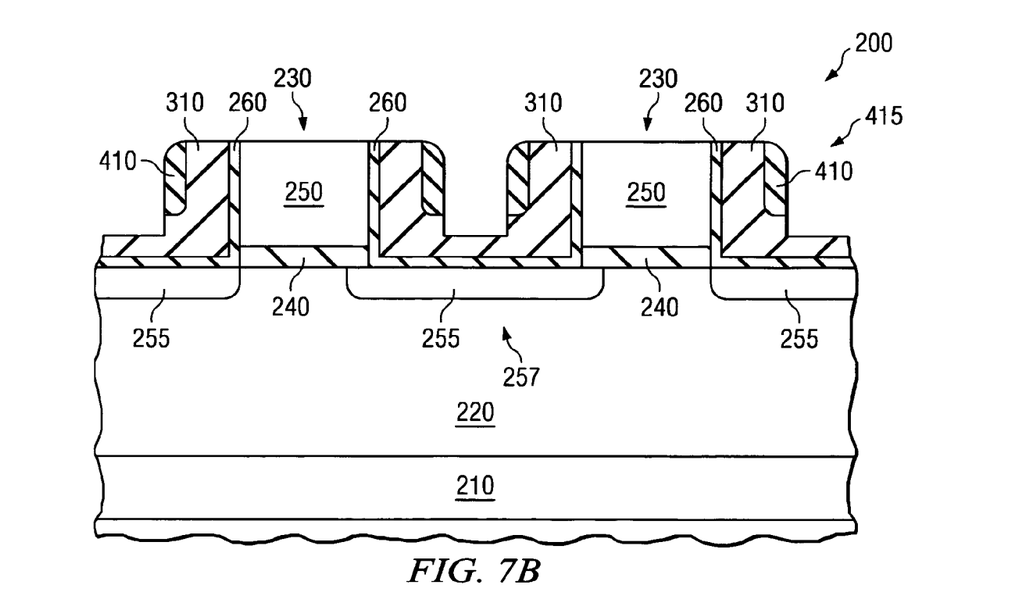
FIG. 7B illustrates a partial sectional view of the partially completed microelectronics device illustrated in FIG. 7A following a silicidation process wherein the metal is incorporated into the gate electrodes but is not incorporated into the protected substrate located over the moat region.

FIG. 7B shows the microelectronics device 200 of FIG. 7A following the silicidation process and removal of the excess metal layer 710 and further illustrating the silicided gate electrodes 250 and the non-silicidation of the moat region 257.

Figure 8:
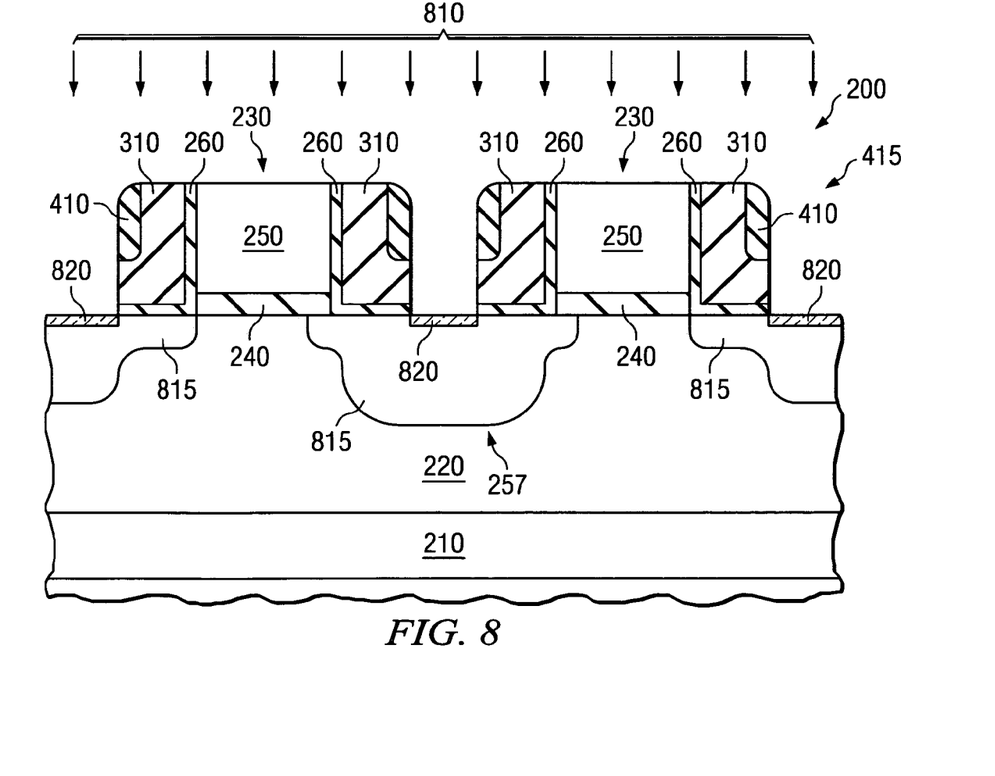
FIG. 8 illustrates a partial sectional view of the partially completed microelectronics device illustrated in FIG. 7B following a subsequent etch that removed the spacer material located over the moat region.

FIG. 8 illustrates a partial sectional view of the partially completed microelectronics device 200 illustrated in FIG. 6 following a conventional subsequent etch 810. The subsequent etch 810 is conducted to remove an additional portion of the spacer material 415 on each of the sidewalls of the gate electrodes 250, but it also removes spacer material, pad oxide layer 260 and nitride layer 310 located over the moat region 257. This not only removes the spacer material 415 over the moat region but opens up the space between the two gate electrodes 250 and allows room for the formation of a contact, as shown in FIG. 1, between the two gate electrodes 250. With the pad oxide layer 260 and nitride layer 310 removed, a conventional source/drain implant can be conducted to complete the formation of the source/drains 815. Generally the source/drain implant involves a high dopant concentration that has a peak dopant concentration ranging from about $1E18$ atoms/cm$^3$ to about $1E21$ atoms/cm$^3$. Also, the highly doped source/drain implant should typically have a dopant type opposite to that of the well region 220 they are located within. Following the source/drain implant, a standard source/drain anneal is conducted to activate the source/drain regions 815. It is believed that a source/drain anneal conducted at a temperature ranging from about 1000° C. to about 1100° C. and a time period ranging from about 1 second to about 5 seconds would be sufficient. It should be noted that other temperatures, times, and processes could be used to activate the source/drain regions 815 and such processes are known to those skilled in the art.

Following the anneal of the source/drains 815, a conventional contact silicidation process is conducted to form contact pads 820 over the source/drains 815 and contacts are formed to arrive at the structure illustrated in FIG. 1.

Figure 9:
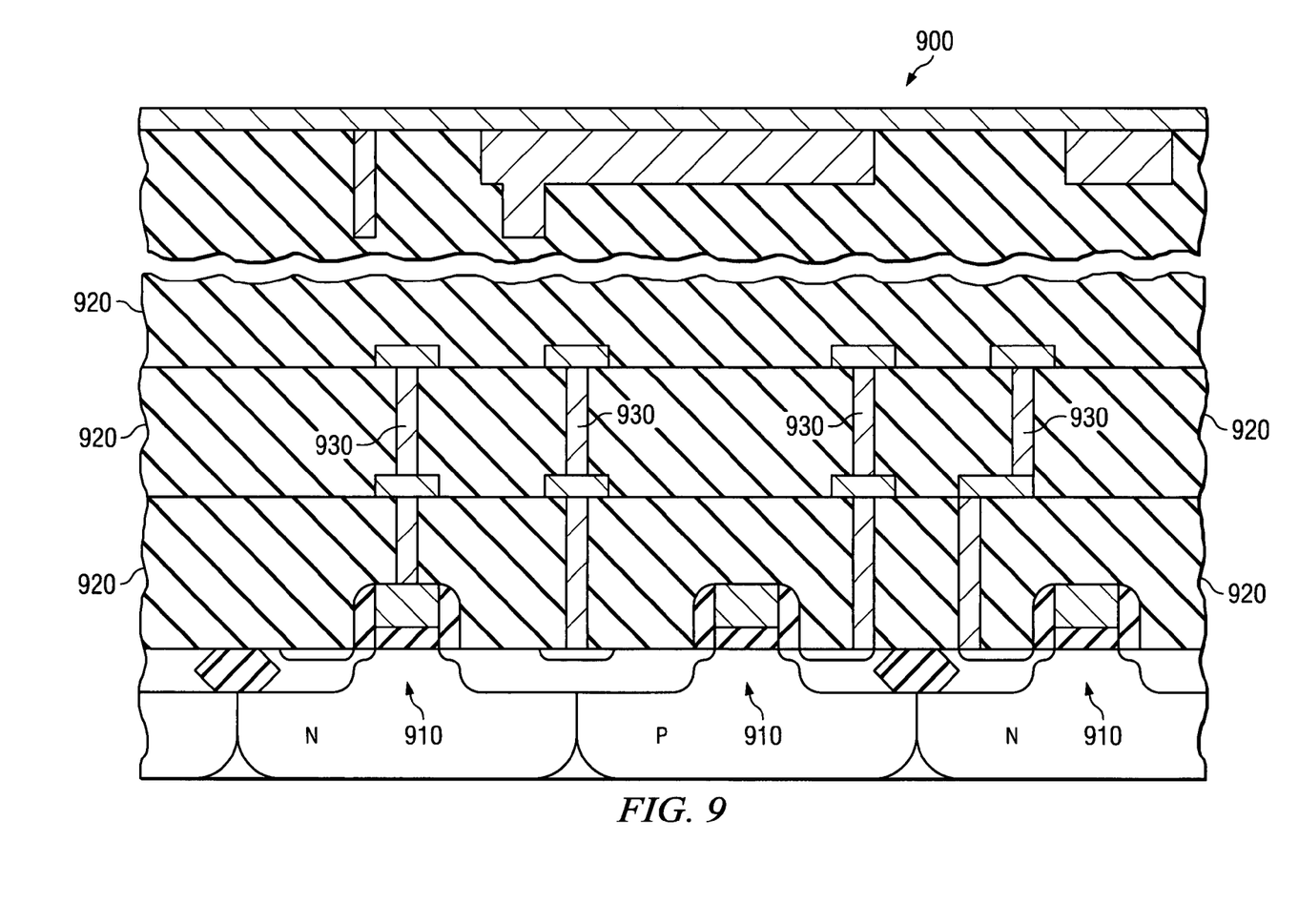
FIG. 9 illustrates an exemplary cross-sectional view of an integrated circuit (IC) incorporating devices constructed according to the principles of the present invention.

Referring finally to FIG. 8, illustrated is an exemplary cross-sectional view of an integrated circuit (IC) 900 incorporating devices 910 constructed according to the principles of the present invention. The devices 910 may include a wide variety of devices, such as transistors used to form CMOS devices, BiCMOS devices, Bipolar devices, as well as capacitors or other types of devices. The IC 900 may further include passive devices, such as inductors or resistors, or it may also include optical devices or optoelectronic devices. Those skilled in the art are familiar with these various types of devices and their manufacture. In the particular embodiment illustrated in FIG. 9, the devices 910 are transistors over which dielectric layers 920 are located, and the transistors include the various components as discussed above. Additionally, interconnect structures 930 are located within the dielectric layers 920 to interconnect various devices 910, thus, forming an operational integrated circuit 900.

Although the present invention has been described in detail, one who is of ordinary skill in the art should understand that they can make various changes, substitutions, and alterations herein without departing from the scope of the invention.

What is claimed is:

1. A method of fabricating a microelectronics device, comprising:

forming a spacer material over gate electrodes located over a microelectronics substrate and over a doped source/drain region located between gate electrodes;

removing a portion of the spacer material with a chemical/mechanical process using a slurry that is selective to the spacer material;

etching a remaining portion of the spacer material to form spacer sidewalls on the gate electrodes, the etching exposing a surface of the gate electrodes and leaving a portion of the spacer material over the doped source/drain region;

placing a metal on the exposed surface of the gate electrodes; and incorporating the metal into the gate electrodes.

2. The method as recited in claim 1, wherein forming a spacer material includes forming a first oxide layer over the gate electrodes, forming a nitride layer over the first oxide layer and forming a second oxide layer over the nitride layer.

3. The method as recited in claim 2, wherein the slurry is selective to the nitride layer such that a removal rate ratio of the oxide to nitride is about 13:1.

4. The method as recited in claim 1, wherein the slurry is cerium oxide.

5. The method as recited in claim 1, wherein removing a portion of the spacer material comprises removing about 20 nm of the spacer material using a pressure ranging from about 0.5 psi to about 2.0 psi and for a period of time ranging from about 30 seconds to about 60 seconds.

6. The method as recited in claim 1, wherein leaving a portion of the spacer material comprises leaving about 15 nm of the spacer material over the doped region.

7. The method as recited in claim 1, wherein incorporating metal into the gate electrodes comprises using a silicide process to form silicided gate electrodes.

8. A method of siliciding gate electrodes of a microelectronics device, comprising:

forming a spacer material, comprising a nitride layer located over an oxide layer, over gate electrodes and first doped source/drain region located therebetween and being located over a microelectronics substrate;

removing a portion of the nitride layer with a chemical/mechanical process using a slurry that has a removal rate ratio of oxide to nitride of about 13:1;

etching the spacer material to form spacer sidewalls on the gate electrodes, the etching exposing an upper surface of the gate electrodes and leaving a portion of the oxide layer over the doped source/drain region;

placing a metal on the exposed upper surface of the gate electrodes;

incorporating the metal into the gate electrodes using a silicidation process;

removing the portion of the oxide layer; and forming a second doped region between the gate electrodes.

9. The method as recited in claim 8, wherein the oxide layer is a first oxide layer and forming a spacer material further comprises forming a second oxide layer over the nitride layer.

10. The method as recited in claim 8, wherein the slurry is cerium oxide.

11. The method as recited in claim 1, wherein removing a portion of the spacer material comprises removing about 20 nm of the nitride layer using a pressure ranging from about 0.5 psi to about 2.0 psi and for a period of time ranging from about 30 seconds to about 60 seconds.

12. The method as recited in claim 1, wherein leaving a portion of the oxide layer comprises leaving about 15 nm of the oxide layer over the doped region.

13. The method as recited in claim 1, wherein incorporating metal into the gate electrodes comprises using a suicide process to incorporate nickel throughout a substantial portion of the gate electrodes' thicknesses.

14. The method as recited in claim 13, wherein the suicide process comprises placing a nickel layer over the gate electrodes wherein a thickness of nickel ranges from about 50% to about 75% of the thickness of the gate electrodes and subjecting the nickel layer and the gate electrodes to a thermal anneal having a temperature ranging from about 400 degrees centigrade to about 600 degrees centigrade and for a period of time ranging from about 10 seconds to about 100 seconds.

15. A method of fabricating an integrated circuit, comprising:

forming transistors that comprise silicided gate electrodes over a microelectronics substrate, comprising;

creating a first doped source/drain region between the gate electrodes;

depositing a spacer material over the gate electrodes and the first doped source/drain region;

removing a portion of the spacer material with a chemical/mechanical process using a slurry that is selective to the spacer material;

etching the spacer material to form spacer sidewalls on the gate electrodes, the etching exposing a surface of the gate electrodes and leaving a portion of the spacer material over the first doped source/drain region;

placing a metal on the exposed surface of the gate electrodes;

incorporating the metal into the gate electrodes to form silicided gate electrodes; and forming a second doped region between the gate electrodes;

forming dielectric layers over the silicided gate electrodes; and forming interconnects in the dielectric layers to electrically connect the transistors to form an operative integrated circuit.

16. The method as recited in claim 15, wherein forming a spacer material includes forming a first oxide layer over the gate electrodes, forming a nitride layer over the first oxide layer and forming a second oxide layer over the nitride layer.

17. The method as recited in claim 16, wherein a removal rate ratio of oxide to nitride is about 13:1 and the slurry is cerium oxide.

18. The method as recited in claim 1, wherein removing a portion of the spacer material comprises removing about 20 nm of the material layer using a pressure ranging from about 0.5 psi to about 2.0 psi and for a period of time ranging from about 30 seconds to about 60 seconds.

19. The method as recited in claim 1, wherein incorporating metal into the gate electrodes comprises using a silicide process to form silicided gate electrodes.

20. The method as recited in claim 19, wherein the suicide process comprises placing a nickel layer over the gate electrodes wherein a thickness of nickel layer ranges from about 50% to about 75% of the thickness of the gate electrodes and subjecting the nickel layer and the gate electrodes to a thermal anneal having a temperature ranging from about 400 degrees centigrade to about 600 degrees centigrade and for a period of time ranging from about 10 seconds to about 100 seconds.

* * * * *